(12) United States Patent
Trott et al.

(10) Patent No.: US 6,651,210 B1
(45) Date of Patent: Nov. 18, 2003

(54) FLEXIBLE MULTI-BIT PER SYMBOL RATE ENCODING

(75) Inventors: Mitchell D. Trott, Mountain View, CA (US); Tibor Boros, Sunnyvale, CA (US)

(73) Assignee: ArrayComm, Inc., San Jose, CA (US)

( * ) Notice: Subject to any disclaimer, the term of this patent is extended or adjusted under 35 U.S.C. 154(b) by 448 days.

(21) Appl. No.: 09/747,829

(22) Filed: Dec. 21, 2000

(51) Int. Cl.[7] .................... H03M 13/25; H03M 13/29; H03M 13/31
(52) U.S. Cl. .................. 714/758; 714/752; 714/774; 714/779; 714/784; 375/261
(58) Field of Search ............................. 714/752, 758, 714/774, 779, 784; 375/261

(56) References Cited

U.S. PATENT DOCUMENTS

| | | | | |
|---|---|---|---|---|
| 5,396,518 A | * | 3/1995 | How ........................... | 375/265 |
| 5,493,586 A | * | 2/1996 | Brownlie et al. ........... | 375/265 |
| 5,953,377 A | * | 9/1999 | Yoshida ...................... | 375/295 |
| 5,966,412 A | * | 10/1999 | Ramaswamy ............... | 375/341 |
| 6,490,260 B1 | * | 12/2002 | Hwang ....................... | 370/335 |
| 6,522,665 B1 | * | 2/2003 | Suzuki et al. .............. | 370/471 |
| 6,557,137 B1 | * | 4/2003 | Park et al. .................. | 714/752 |

OTHER PUBLICATIONS

Pottie et al., Multilevel Codes Based on Partitioning, 1989, pp. 87–98.
Wolf et al., P2 Codes: Pragmatic Trellis Codes Utilizing Punctured Convolutional Codes, 1995, pp. 94–99.
IEEE Transactions on Information Theory, vol. 42, No. 2, Mar. 1996, pp. 627–636.

* cited by examiner

Primary Examiner—R. Stephen Dildine
(74) Attorney, Agent, or Firm—Blakely, Sokoloff, Taylor & Zafman LLP

(57) ABSTRACT

In one embodiment, the present invention comprises a demultiplexer to divide a bit stream into a first block at a first output and a second block at a second output, a convolutional coder coupled to the first output to encode the first block and a block coder coupled to the second output to encode the second block. The invention further includes a function module coupled to the block coder to apply one of a plurality of different functions to the encoded second block to produce a third block at an output and a mapper coupled to the function module output and to the convolutional coder to map the third block from the output of the function module and the encoded first block into one of a plurality of modulation constellations. A controller is coupled to the demultiplexer to control the size of the first and second blocks, is coupled to the block coder to control the block coding, and is coupled to the function module to control the function to be applied.

29 Claims, 7 Drawing Sheets

FLEXIBLE MULTI-BIT PER SYMBOL RATE ENCODING

BACKGROUND OF THE INVENTION

1. Field of the Invention

The present invention applies to the field of digital communications systems and, in particular, to flexible bit-rate encoding systems for multi-ary modulation systems.

2. Description of the Prior Art

Presently in transmitting and receiving digital data across noisy channels, it is difficult to find a suitable compromise between adequate bandwidth efficiency and adequate recoverability of the transmitted signal. With high date rates, a signal may not accurately be received, demodulated and recovered. With more modest data rates, the efficiency of the system is reduced. In order to provide a robust communications link, the data rate must be limited. However, in a changing channel, this limit will also change, so that a system that accommodates only a single data rate can not always employ the optimal data rate under the circumstances.

In some systems, it is possible to vary the bit rate, or symbol rate of signal transmissions, however this often complicates the hardware and software required to implement the system. Other systems permit the modulation scheme to be changed but at still greater cost. The present invention allows the transmitted bit rate to be changed as the quality of the channel changes without significantly complicating the hardware and software. This provides a better combination of error correction coding for the available channel. It is suitable for any kind of digital communications but is particularly suitable for wireless low mobility digital data communications systems.

BRIEF SUMMARY OF THE INVENTION

In one embodiment, the invention comprises a demultiplexer to divide a bit stream into a first block at a first output and a second block at a second output, a convolutional coder coupled to the first output to encode the first block and a block coder coupled to the second output to encode the second block The invention further includes a function module coupled to the block coder to apply one of a plurality of different functions to the encoded second block to produce a third block at an output and a mapper coupled to the function module output and to the convolutional coder to map the third block from the output of the function module and the encoded first block into one of a plurality of modulation constellations. A controller is coupled to the demultiplexer to control the size of the first and second blocks, is coupled to the block coder to control the block coding, and is coupled to the function module to control the function to be applied.

BRIEF DESCRIPTION OF THE SEVERAL VIEWS OF THE DRAWINGS

The present invention is illustrated by way of example, and not by way of limitation, in the figures of the accompanying drawings in which like reference numerals refer to similar elements and in which.

DETAILED DESCRIPTION OF THE INVENTION

Base Station Structure

Figure 1:
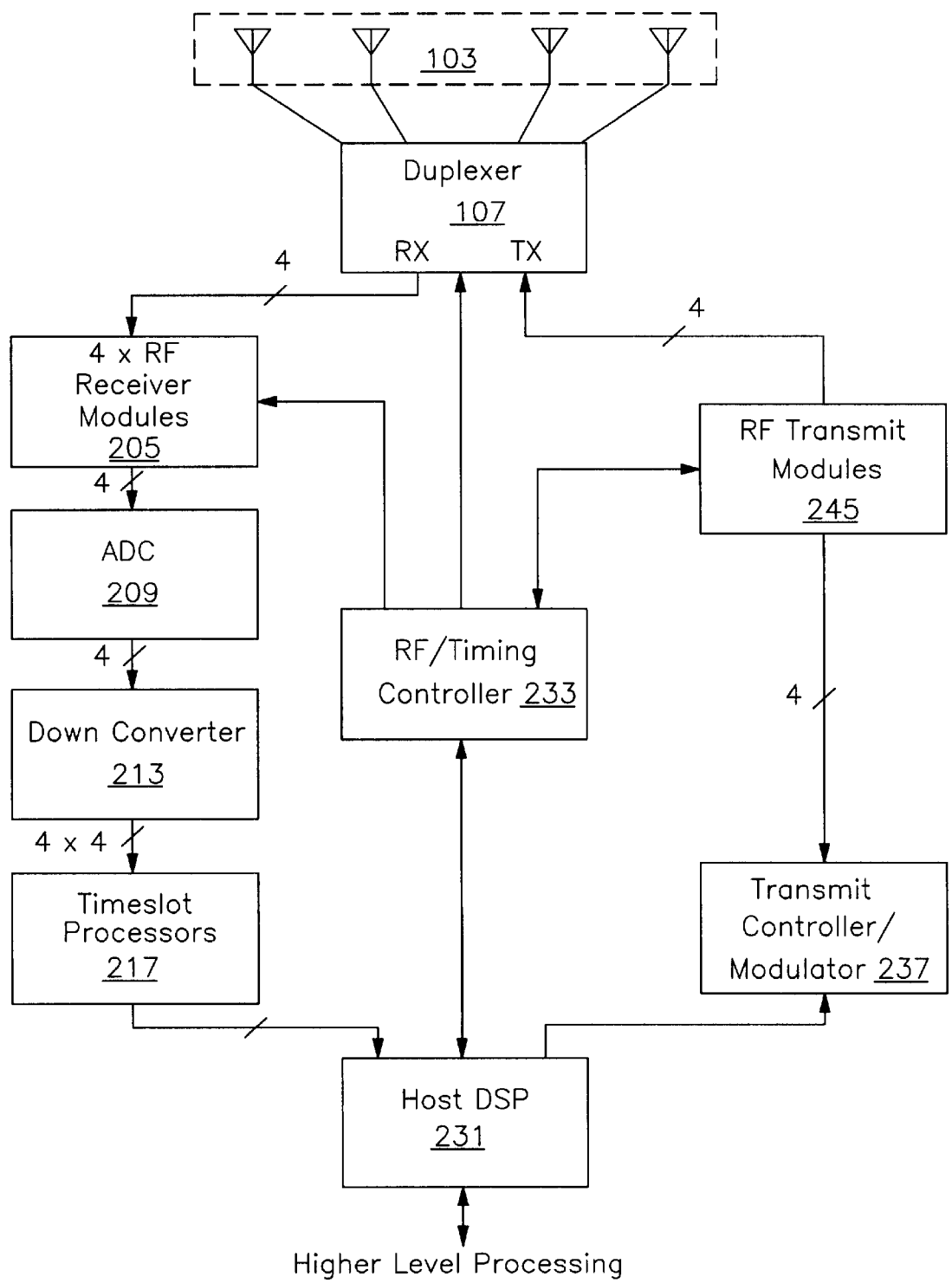
FIG. 1 is a block diagram illustrating an exemplary architecture of a wireless communication system base station appropriate for use with one embodiment of the present invention.

The present invention relates to wireless communication systems and may be a fixed-access or mobile-access wireless network using spatial division multiple access (SDMA) technology in combination with multiple access systems, such as time division multiple access (TDMA), frequency division multiple access (FDMA) and code division multiple access (CDMA). Multiple access can be combined with frequency division duplexing (FDD) or time division duplexing (TDD). FIG. 1 shows an example of a base station of a wireless communications system or network suitable for implementing the present invention. The system or network includes a number of subscriber stations, also referred to as remote terminals or user terminals, such as that shown in FIG. 2. The base station may be connected to a wide area network (WAN) through its host DSP 231 for providing any required data services and connections external to the immediate wireless system. To support spatial diversity, a plurality of antennas 103 is used, for example four antennas, although other numbers of antennas may be selected.

The outputs of the antennas are connected to a duplexer switch 107, which in this TDD system is a time switch. Two possible implementations of switch 107 are as a frequency duplexer in a frequency division duplex (FDD) system, and as a time switch in a time division duplex (TDD) system. When receiving, the antenna outputs are connected via switch 107 to a receiver 205, and are mixed down in analog by RF receiver ("RX") modules 205 from the carrier frequency to an FM intermediate frequency ("IF"). This signal then is digitized (sampled) by analog to digital converters ("ADCs") 209. Final down-converting to baseband is carried out digitally. The down-converting can be done using finite impulse response (FIR) filtering techniques. This is shown as block 213. The invention can be adapted to suit a wide variety of RF and IF carrier frequencies and bands.

There are, in the present example, four down-converted outputs from each antenna's digital filter device 213, one per receive timeslot. The particular number of timeslots can be varied to suit network needs. While the present example uses four uplink and four downlink timeslots for each TDD frame, desirable results have also been achieved with three timeslots for the uplink and downlink in each frame. For each of the four receive timeslots, the four down-converted outputs from the four antennas are fed to a digital signal processor (DSP) device 217 (hereinafter "timeslot processor") for further processing, including calibration, according to one aspect of this invention. Four Motorola DSP56303 DSPs can be used as timeslot processors, one per receive timeslot. The timeslot processors 217 monitor the received signal power and estimate the frequency offset and time alignment. They also determine smart antenna weights for each antenna element. These are used in the spatial division multiple access scheme to determine a signal from a particular remote user and to demodulate the determined signal.

The output of the timeslot processors 217 is demodulated burst data for each of the four receive timeslots. This data is sent to the host DSP processor 231 whose main function is to control all elements of the system and interface with the higher level processing, which is the processing which deals with what signals are required for communications in all the different control and service communication channels defined in the system's communication protocol. The host DSP 231 can be a Motorola DSP56303. In addition, timeslot processors send the determined receive weights for each user terminal to the host DSP 231. The host DSP 231 maintains state and timing information, receives uplink burst data from the timeslot processors 217, and programs the timeslot processors 217. In addition it decrypts, descrambles, checks error detecting code, and deconstructs bursts of the uplink signals, then formats the uplink signals to be sent for higher level processing in other parts of the base station. With respect to the other parts of the base station it formats service data and traffic data for further higher processing in the base station, receives downlink messages and traffic data from the other parts of the base station, processes the downlink bursts and formats and sends the downlink bursts to a transmit controller/modulator, shown as 237. The host DSP also manages programming of other components of the base station including the transmit controller/modulator 237 and the RF timing controller shown as 233.

The RF timing controller 233 interfaces with the RF system, shown as block 245 and also produces a number of timing signals that are used by both the RF system and the modem. The RF controller 233 reads and transmits power monitoring and control values, controls the duplexer 107 and receives timing parameters and other settings for each burst from the host DSP 231.

The transmit controller/modulator 237, receives transmit data from the host DSP 231, four symbols at a time. The transmit controller uses this data to produce analog IF outputs which are sent to the RF transmitter (TX) modules 245. Specifically, the received data bits are converted into a complex modulated signal, up-converted to an IF frequency, 4-times over-sampled, multiplied by transmit weights obtained from host DSP 231, and converted via digital to analog converters ("DACs") which are part of transmit controller/modulator 237 to analog transmit waveforms. The analog waveforms are sent to the transmit modules 245.

The transmit modules 245 up-convert the signals to the transmission frequency and amplify the signals. The amplified transmission signal outputs are sent to antennas 103 via the duplexer/time switch 107.

User Terminal Structure

Figure 2:
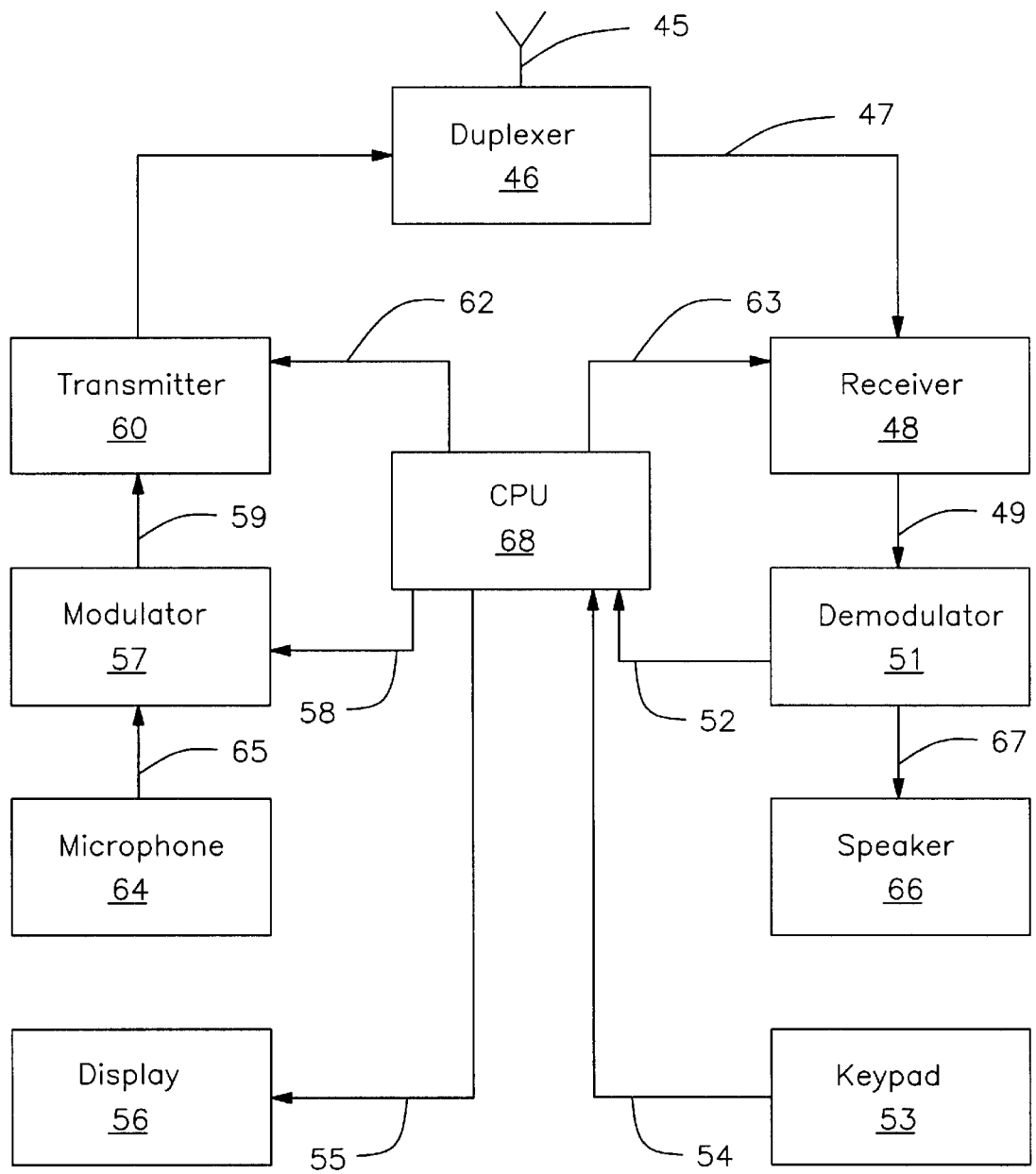
FIG. 2 is a block diagram illustrating an exemplary architecture of a wireless communications system remote station appropriate for use with the present invention.

FIG. 2 depicts an example component arrangement in a remote terminal that provides data or voice communication. The remote terminal's antenna 45 is connected to a duplexer 46 to permit antenna 45 to be used for both transmission and reception. The antenna can be omni-directional or directional. For optimal performance, the antenna can be made up of multiple elements and employ spatial processing as discussed above for the base station. In an alternate embodiment, separate receive and transmit antennas are used eliminating the need for the duplexer 46. In another alternate embodiment, where time division duplexing is used, a transmit/receive (TR) switch can be used instead of a duplexer as is well-known in the art. The duplexer output 47 serves as input to a receiver 48. The receiver 48 produces a down-converted signal 49 which is the input to a demodulator 51. A demodulated received sound or voice signal 67 is input to a speaker 66.

The remote terminal has a corresponding transmit chain in which data or voice to be transmitted is modulated in a modulator 57. The modulated signal to be transmitted 59, output by the modulator 57, is up-converted and amplified by a transmitter 60, producing a transmitter output signal 61. The transmitter output 61 is then input to the duplexer 46 for transmission by the antenna 45.

The demodulated received data 52 is supplied to a remote terminal central processing unit 68 (CPU) as is received data before demodulation 50. The remote terminal CPU 68 can be implemented with a standard DSP (digital signal processor) device such as a Motorola series 56300 DSP. This DSP can also perform the functions of the demodulator 51 and the modulator 57. The remote terminal CPU 68 controls the receiver through line 63, the transmitter through line 62, the demodulator through line 52 and the modulator through line 58. It also communicates with a keyboard 53 through line 54 and a display 56 through line 55. A microphone 64 and speaker 66 are connected through the modulator 57 and the demodulator 51 through lines 65 and 66, respectively for a voice communications remote terminal. In another embodiment, the microphone and speaker are also in direct communication with the CPU to provide voice or data communications.

The remote terminal's voice signal to be transmitted 65 from the microphone 64 is input to a modulator 57. Traffic and control data to be transmitted 58 is supplied by the remote terminal's CPU 68. Control data 58 is transmitted to base stations during registration, session initiation and termination as well as during the session as described in greater detail below.

In an alternate embodiment, the speaker 66, and the microphone 64 are replaced or augmented by digital interfaces well-known in the art that allow data to be transmitted to and from an external data processing device (for example, a computer). In one embodiment, the remote terminal's CPU is coupled to a standard digital interface such as a PCMCIA interface to an external computer and the display, keyboard, microphone and speaker are a part of the external computer. The remote terminal's CPU 68 communicates with these components through the digital interface and the external computer's controller. For data only communications, the microphone and speaker can be deleted. For voice only communications, the keyboard and display can be deleted.

Signal Modulation

Figure 3:
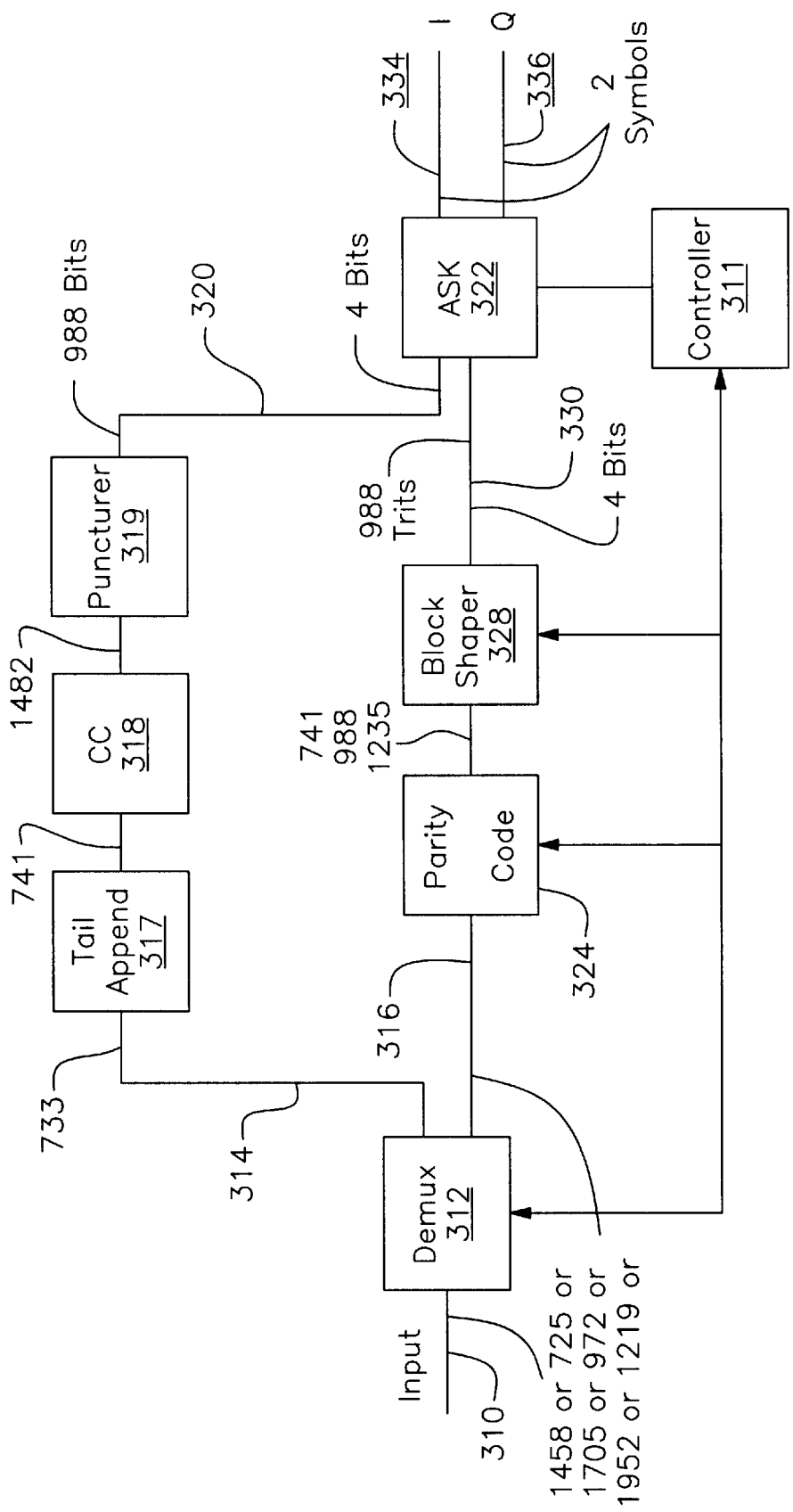
FIG. 3 is block diagram of a first configuration of a codec according to one embodiment of the present invention.

FIG. 3 shows a block diagram of a signal modulator, corresponding to block 237 of FIG. 1, or block 57 of FIG. 2, according to one embodiment of the present invention. While only the portion related to encoding is shown, the invention is equally applicable to decoding with appropriate reversal of the described steps as is implemented in the signal demodulator 51 of FIG. 2 and as well-known in the art. In one example, the blocks shown in FIG. 3 are implemented in a general purpose DSP (digital signal processor) such as a Motorola 56300 series DSP.

In one embodiment, the incoming bit stream 310 is processed in variable bit sized blocks. The precise number of bits may be varied here as well as throughout the description to better suit particular applications. In the present invention, a demultiplexer 312 is configurable by a controller module 311 to accept blocks of different sizes in order to support different bit-per-symbol rates at the other end of the modulator. In one example, the input blocks contain either 1458, 1705, or 1952 bits depending on the selected bit-per-symbol rate. These numbers have been chosen because the number of symbols selected for transmission in each downlink time slot of each time division duplex frame has been selected as 494.

As discussed below, applying the methods of the present invention maps the three different block sizes into 494 symbols. In an exemplary embodiment, 182 symbols has been selected for each uplink slot, accordingly for uplink slots, the input blocks are different than for downlink slots. The uplink slot is not discussed herein in order to simplify the description, however the same principles as applied here to the downlink slot apply also to the uplink slot. The particular selections of symbol rates and input block sizes can be selected to suit the particular application as appropriate. The input block is encrypted and contains some error detecting coding such as a 16-bit cyclic redundancy code in the last 16 bit positions. This encryption and coding is typically performed at earlier stages of physical layer processing by the same general purpose DSP.

The input block bits are divided roughly in half in the demultiplexer 312 so that roughly one half goes to an upper path 314 and roughly half to a lower path 316. In every case in the present example, the upper path receives 733 bits. The division is done by assigning the initial 733 bits in the input block to the upper path 314 and the remaining bits to the lower path 316. Accordingly, the lower path receives either 725, 972 or 1219 bits depending on the input size block. However, the bits can be divided in any convenient fashion that is reversible in a receive channel.

The upper path is provided first to a tail bit append block. This block adds eight zero value tail bits to the upper block forming a 741-bit block. The tail append block can be modified or removed altogether, or one value bits may be used depending upon the needs of the particular system. The upper block with the eight appended tail bits is then supplied to a convolutional coder 318.

In one embodiment, this convolutional coder 318 has 256 states and is of constraint length 9 with 1 message bit per 2 coded bits. The coder is defined by the two generator sequences 561 and 753 (octal) or equivalently 101110001 and 111101011 (binary). The first and second generator sequences define the shift register taps for the first and second encoder output bits, respectively. The coder is initialized to the zero state before each 741 bit block. The outputs of the encoder are concatenated serially, alternating between the two shift register taps of the generator sequences to form a coded output bit stream of 1482 bits. Many other convolutional codes may be used with the present invention to suit particular applications as is well-known in the art. The 1482-bit convolutionally coded blocks are passed next to a puncturer 319.

In one embodiment, the coded output bit stream is then punctured to delete the fourth and sixth bit from every set of six bits. Accordingly the output encoded bit stream 320 of the convolutional coder is reduced to 988 bits and formed into 247 four-bit blocks. The structure, after puncturing, is $c_1c_2c_3c_5, c_7c_8c_9c_{11}, c_{13}c_{14}c_{15}c_{17}, \ldots$, where c represents a convolutionally coded bit. Other puncturing schemes may also be selected applying techniques well-known in the art. The puncturer may be coupled to the controller 311 so that it can be enabled or disabled or so that the puncturing rate can be modified.

The punctured upper path is next supplied to an amplitude shift keying mapper 322 which provides I and Q signal lines 334, 336 mapped into a 12, 16 or 24 Quadrature Amplitude Modulation (QAM) constellation to be described in greater detail below.

The lower output 316 of the demultiplexer 312 is applied to a simple parity coder 324. The parity coder adds sixteen parity bits to the input block to render the blocks into sizes of 741, 988 and 1235 bits respectively. Each parity bit is computed by taking the bit-wise exclusive or (XOR) of a block of 47, 63 or 79 input bits, respectively. The last block of input bits being shorter as appropriate. As an alternative, a Hamming coder or any other kind of block coder could be used depending upon the computational resources available to the system and the needs of the demodulation scheme. Since the parity coding operation in the present embodiment operates on different sized input blocks, the parity coder is shown as being coupled to the controller. The block coder can also be coupled to the controller, if desired, to support different block coding schemes.

The coded block is passed next to a function module 328 such as a block shaper. The function module, in one embodiment, is a set of block shaping look-up tables that convert the input bits into output sequences. The nature of the table and of the output sequences depends upon the size of the input block and accordingly is set by the controller. The tables are selected to produce an appropriate shaped block for modulation over the communications channel. Alternatively the function module can be a set of software modules that apply one of plurality of different functions to the input bits in order to produce the third block of bits on line 330. The block shaper can also be a set of logic or functional gates in and ASIC or other DSP. The selection of the gates and accordingly, the function that is applied is again determined by the controller 311. The output sequences on line 330 are connected as the third block to the ASK mapper 322 which combines this third block output with the upper path bits to provide I and Q signal lines 334, 336 mapped into the QAM constellation.

In one embodiment, the output of the shaper is a trit, a trinary or base three digit having a value of 0, 1 or 2. Two trits are combined in the ASK mapper with two bits from the upper path to determine a constellation point, i.e. a symbol, in the QAM constellation shown in FIG. 4. The particular nature of the constellation, whether 12-,16- or 24- QAM, is determined by the mapping function performed by the block shaper 328. A first trit and bit determine the I coordinate in the constellation and the second trit and second bit determine the Q coordinate. Table 1 shows a mapping structure that can be used by the ASK mapper. The coordinate is the value on the I or Q axis as shown on FIG. 4.

As can be seen from Table 1, the trit determines the amplitude of the modulation, i.e. the distance along the axis from the origin. The bit determines the sign of the magnitude, i.e. the sector in FIG. 4 for the point. This distinction aids in the demodulation of the symbols by the receiver. Alternatively, the relationship can be switched, or a different relationship can be used. While trit, bit combinations are used in the present description for clarity, equivalent binary values can be substituted for the trits. As is well-known in the art, the base of the numbering system, whether binary, trinary, decimal, hexadecimal or any other system can be selected to best suit the particular implementation involved.

TABLE 1

| Trit | 2 | 1 | 0 | 0 | 1 | 2 |
|---|---|---|---|---|---|---|
| Bit | 0 | 1 | 0 | 1 | 0 | 1 |
| Coordinate | −5 | −3 | −1 | 1 | 3 | 5 |

Figure 4:
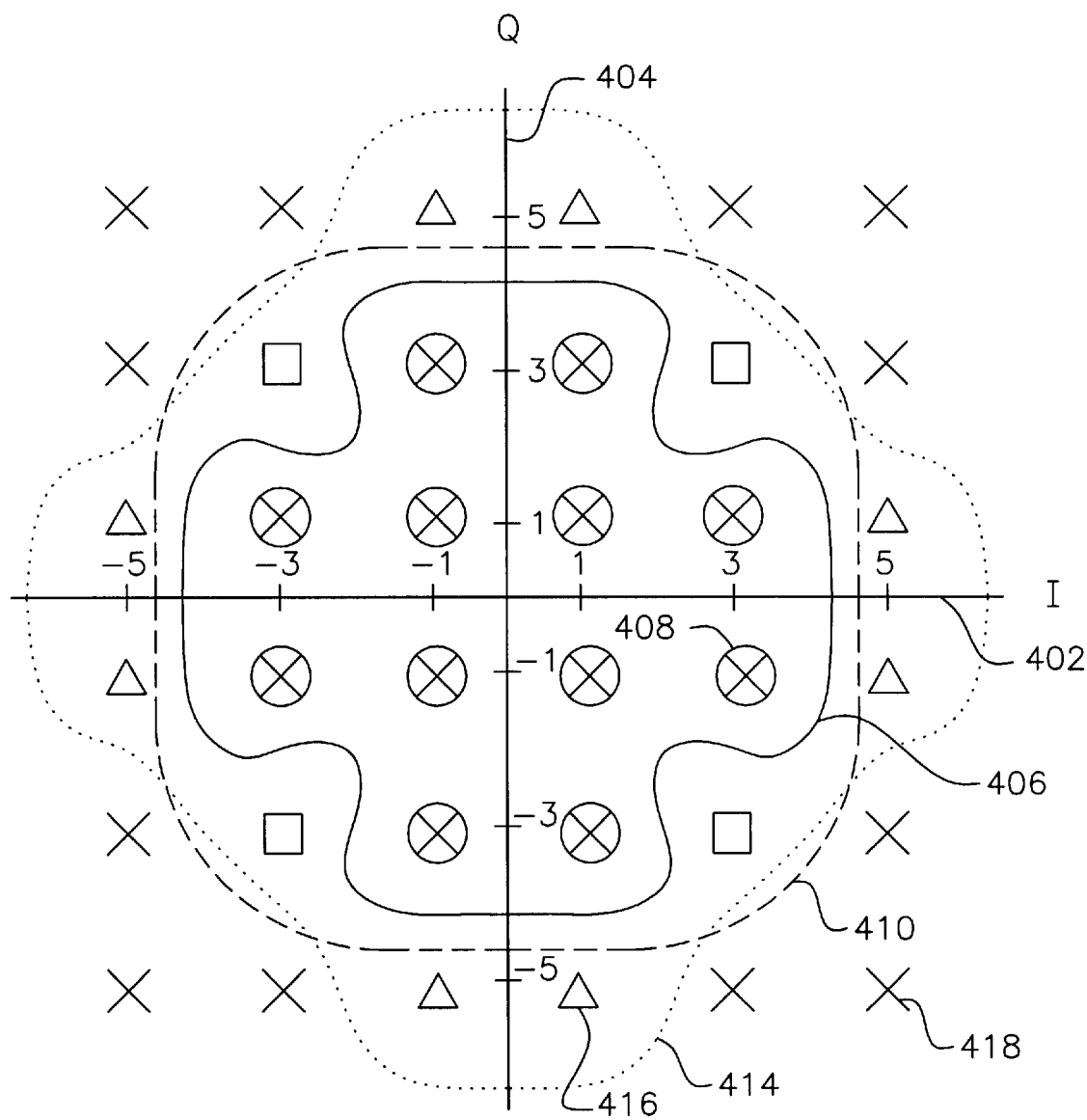
FIG. 4 is a diagram of a quadrature amplitude modulation constellation for use in one embodiment of the present invention.

FIG. 4 shows an exemplary 36-ary QAM constellation. The constellation has an I (in-phase) axis 402 and an orthogonal Q (quadrature) axis 404. Each of the 36 constellation points are aligned with values of ±1, ±3 or ±5 on the coordinate axes, as is well-known in the art. The values on the I and Q axes correspond to the "Coordinate" row shown in Table 1 above. As Table 1 shows, each point is associated with a trit, bit combination from 00 to 21 and has corresponding I and Q coordinates. While, in the present embodiment, the symbols are mapped directly to the corresponding points on the I,Q axes, this is not required. A variety of alternative mapping approaches may be used. Alternatively, binary values can be mapped to every other or every third or fourth point around the constellation in order to obtain a more desirable distribution of symbols for transmission. Alternatively, other constellations may be used instead of the rectangular constellation shown in FIG. 4 such as circular, triangular and hexagonal constellations. In addition while multi-ary QAM constellations are shown in the illustrated embodiments other multi-ary transmission technologies such as phase shift keying (PSK) or frequency shift keying (FSK) can be employed instead.

The block shaper uses different tables to form the trits depending on the size of the input block. A suitable table in one embodiment for the smallest block, the 741-bit block, is as shown below in Table 2. This table considers three bits at a time and produces an output of four trits for every three bits. In this table, the trinary digit of value 2 is not used, so the output trits appear to be four binary digits but they are considered as trits by the ASK mapper. These trits can be represented as binary numbers in software or hardware which is developed to implement the present invention. Variations on the table can be made to meet different system demands. The table below preserves parity from input to output and minimizes the trit values, 2 is not used and 1 is used minimally. Since the mapping scheme in Table 1 above assigns trits of 2 and 1 to higher power levels in the QAM constellation, minimizing the use of 2 and 1 reduces the average power of the transmitted signal.

TABLE 2

| Bits in | 000 | 001 | 010 | 011 | 100 | 101 | 110 | 111 |
|---|---|---|---|---|---|---|---|---|
| Trits | 0000 | 0001 | 0010 | 0101 | 0100 | 0110 | 1010 | 1000 |

Referring to FIG. 4, it can be seen that if the trits of Table 2 are applied against the mapping of Table 1 only a small number of the possible constellation points will be mapped. These points are enclosed by a solid line 406 and shown as circles with cross hairs 408 in FIG. 4 and create a 12-ary constellation. In the two pairs of output trits of Table 2, 1's do not occur consecutively in the first pair or in the second pair. As a result, from Table 1, the comer points of coordinates (±3, ±3) will not be used, thereby avoiding the higher power required for these points as compared to the points that lie closer to the origin. These comer points are shown as squares 412 in FIG. 4.

For the larger 988-bit block, a different table is used, as selected by the controller. This table maps each set of four input bits directly into four output trits. Each input binary digit is identical to each output trinary digit. As in Table 2, parity is preserved and the trinary digit 2 is avoided completely. Referring again to Table 1, the possible constellation points are those enclosed within the dashed line 410. This includes the points 408 of the 12-ary constellation and the comer points 412 shown as squares in FIG. 4. Any constellation point with a coordinate on either axis of ±5 is avoided, limiting the average power of the modulated signal. These points are shown as triangles 416 and crosses 418 in FIG. 4. The possible points make up a conventional 16-ary QAM constellation.

TABLE 3

| Bits in | 0000 | 0001 | 0010 | 0011 | 0100 | 0101 | 0110 | 0111 |
|---|---|---|---|---|---|---|---|---|
| Trits | 0000 | 0001 | 0010 | 0011 | 0100 | 0101 | 0110 | 0111 |
| Bits in | 1000 | 1001 | 1010 | 1011 | 1100 | 1101 | 1110 | 1111 |
| Trits | 1000 | 1001 | 1010 | 1011 | 1100 | 1101 | 1110 | 1111 |

For the largest input block, the 1235-bit input block, a third table is used. This table maps five input bits into four output trits. The 32 columns of the table can be represented as shown in Table 4 below. In the table, $i2$ refers to the second input bit, whether 0 or 1. $i3$, $i4$ and $i5$ correspondingly refer to the third, fourth and fifth input bits, respectively. $1-i5$ refers to the binary complement of the fifth input bit, i.e. if $i5$ is 0, then $1-i5$ is 1 and if $i5$ is 1, then $1-i5$ is 0. This table, like Tables 2 and 3 preserves parity between the input and the output, where the trit values of 1 and 2 are taken to have the same parity. Table 4 also features few 2's and 1's, accordingly reducing the power required to transmit the symbols as discussed above.

TABLE 4

| Bits in | 0 i2 i3 i4 i5 | 1 0 0 i4 i5 | 1 0 1 i4 i5 | 1 1 0 i4 i5 | 1 1 1 i4 i5 |
|---|---|---|---|---|---|
| Trits | i2 i3 i4 i5 | 2 0 i4 i5 | 0 2 i4 1 −i5 | i4 1 −i5 2 0 | i4 i5 0 2 |

Referring again to Table 1 and the constellation of FIG. 4. The trits are combined in pairs with pairs of bits to generate a constellation point. The trit 2 invokes a coordinate of ±5 on one of the axes. Since in Table 4 there is no pair of output trits of 2,2, the extreme corners of the 36-ary constellation of FIG. 4 will not be used by the ASK mapper. Further since there is no trit pair containing 2 and 1, e.g. (2,1) and (1,2), the points with coordinates (±3, ±5) and (±5, ±3) are also avoided. These points are marked with crosses 418 in FIG. 4. The remaining points that are possible symbols for the largest input block are enclosed by the dotted line 414 in FIG. 4 and constitute a 24-ary QAM constellation.

As can be seen from the discussion above, for each bit-per-symbol rate, the ASK mapper takes 988 bits and 988 trits, combines them and maps them into 494 symbols in a 12-, 16-, or 24-ary QAM constellation. The symbols are built using the lower line 330 from the block shaper 328 as the most significant trit and the upper convolutional coded line 320 as the least significant bit, however, the bits may be combined in any other way. Any one input block to the demultiplexer 312 on the main input line 310 will accordingly be mapped into 494 consecutive symbols. These are presented as I and Q coordinates on the I and Q lines 334, 336 for transmission over the channel as is well-known in the art. In the system architecture of FIG. 1, the QAM constellation is modulated onto the appropriate carrier and transmitted through antennas 103 or the antenna of the remote terminal 45.

As mentioned above, the size of the blocks input to the system can be varied in order to accommodate different system requirements. While three examples have been set forth herein, many more possibilities can be developed as is well-known in the art. As can be seen from the specific examples provided above, the present invention converts a 1458-bit, 1705-bit or 1952-bit block into two 494-bit or trit blocks that are mapped into 494 symbols. Accordingly, the system provides alternatives of roughly 3, 3 ½, and 4 bits per symbol. These different rates provides flexibility to accommodate channels of varying quality. Further variations in bit rates can be added, employing the teachings of the present invention in several ways. Further tables can be added to the block shaper to support further bit rate mappings. This might permit quaternary, 32-ary and 36-ary QAM, for example, as shown in FIG. 4. The puncture rate may be varied and the number of tail bits appended to the upper line may be varied. The type of block code can also be varied to suit different bit rates and puncturing can be added to the lower line.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

The present invention includes various steps. The steps of the present invention may be performed by hardware components, such as those shown in FIGS. 1 and 2, or may be embodied in machine-executable instructions, which may be used to cause a general-purpose or special-purpose processor or logic circuits programmed with the instructions to perform the steps. Alternatively, the steps may be performed by a combination of hardware and software. The steps have been described as being performed by either the base station or the user terminal. However, any steps described as being performed by the base station may be performed by the user terminal and vice versa. The invention is equally applicable to systems in which terminals communicate with each other without either one being designated as a base station, a user terminal, a remote terminal or a subscriber station.

The present invention may be provided as a computer program product which may include a machine-readable medium having stored thereon instructions which may be used to program a computer (or other electronic devices) to perform a process according to the present invention. The machine-readable medium may include, but is not limited to, floppy diskettes, optical disks, CD-ROMs, and magneto-optical disks, ROMs, RAMs, EPROMs, EEPROMs, magnet or optical cards, flash memory, or other type of media/machine-readable medium suitable for storing electronic instructions. Moreover, the present invention may also be downloaded as a computer program product, wherein the program may be transferred from a remote computer to a requesting computer by way of data signals embodied in a carrier wave or other propagation medium via a communication link (e.g., a modem or network connection).

Importantly, while the present invention has been described in the context of a wireless internet data system for portable handsets, it can be applied to a wide variety of different wireless systems in which data are exchanged. Such systems include voice, video, music, broadcast and other types of data systems without external connections. The present invention can be applied to fixed remote terminals as well as to low and high mobility terminals. Many of the methods are described in their most basic form but steps can be added to or deleted from any of the methods and information can be added or subtracted from any of the described messages without departing from the basic scope of the present invention. It will be apparent to those skilled in the art that many further modifications and adaptations can be made. The particular embodiments are not provided to limit the invention but to illustrate it. The scope of the present invention is not to be determined by the specific examples provided above but only by the claims below.

Figure 5:
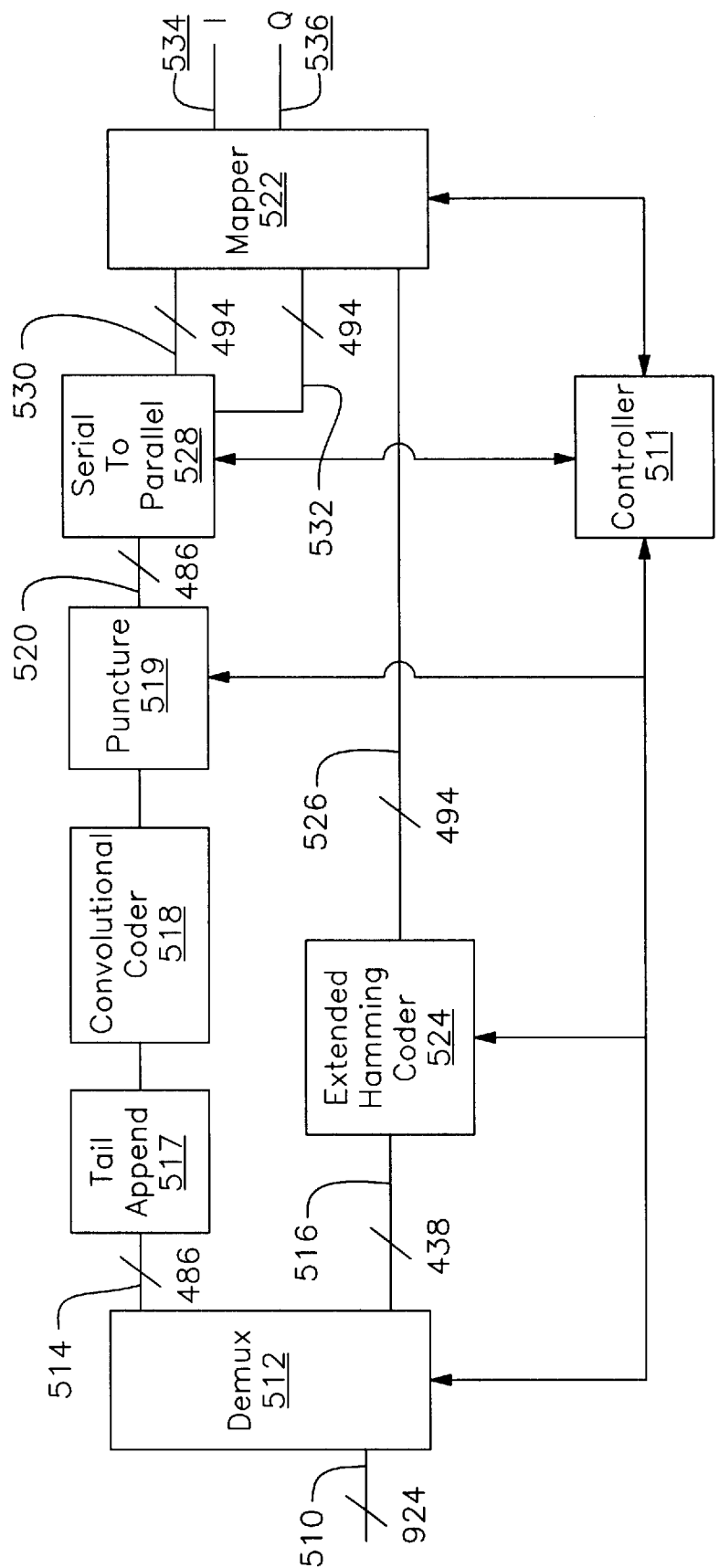
FIG. 5 is block diagram of a second configuration of a codec according to one embodiment of the present invention.

FIG. 5 shows a block diagram of an alternative signal modulator employing many of the same functional blocks as the signal modulator of FIG. 3. The modulator of FIG. 5, however provides a lower bit-per-symbol rate to further enhance the flexibility of the system. Again, while only the portion related to encoding is shown, the invention is equally applicable to decoding with appropriate reversal of the described steps as is implemented in the signal demodulator 51 of FIG. 2 and as well-known in the art. In one example, the blocks shown in FIG. 5 are implemented in the same general purpose DSP (digital signal processor) such as a Motorola 56300 series DSP.

In one embodiment, the incoming bit stream 510 is processed in 924 bit blocks, although the precise number of bits may be varied here as well as throughout the description to better suit particular applications. In the present invention a 924-bit block has been chosen because the number of symbols selected for transmission in each downlink time slot of each time division duplex frame has been selected as 494. As discussed below, applying the methods of the present invention maps the 924 bits into 494 symbols. For the uplink slot 182 symbols have been selected for each slot, accordingly the input block has 335 bits. The particular selections of symbol rates and input block sizes can be selected to suit the particular application as appropriate. As with the configuration of FIG. 3, the 924-bit block is encrypted and contains some error detecting coding such as a 16-bit cyclic redundancy code in the last 16 bit positions. This encryption and coding is typically performed at earlier stages of physical layer processing by the same general purpose DSP.

The 924 bits are divided roughly in half in a demultiplexer 512 so that there is a 486 bit stream and a 438 bit stream. The division is done by assigning the first 486 bits to the upper path 514 and the succeeding 438 bits to the lower path 516. However, the bits can be divided in any convenient fashion that is reversible in a receive channel. The upper path is provided to a convolutional coder 518. The demultiplexer is coupled to a controller module 511 that sets the particular division parameters for the demultiplexer depending upon the modulation configuration selected for use.

The convolutional coder 518 is substantially the same as the convolutional coder 318 of FIG. 3. It is preceded by a tail append module 517. The coded output bit stream is then punctured 519 to delete the fourth and sixth bit from every set of six bits as described in the puncturer 319 of FIG. 3. Accordingly, the output encoded bit stream 520 of the convolutional coder is formed into 247 four-bit blocks. In order to maintain the coded output on line 520 at 988 bits, the input 514 to the convolutional coder is accordingly increased 517 to about 729 bits. Other puncturing schemes may also be selected applying techniques well-known in the art.

The 988-bit coded blocks are passed next to a serial to parallel mapper or divider 528. This divider takes the odd bits and feeds them to the upper line 530 as a 494-bit block. The even bits are fed to a lower line output 532 as a second 494-bit block. The two output lines are connected to a PSK mapper 522 which provides I and Q signal lines 534, 536 for the in-phase and quadrature signals of, for example, an 8PSK constellation.

The lower 438-bit output 516 of the demultiplexer is applied to an extended Hamming coder 524. The extended Hamming coder first breaks the 438 bit block into 7 blocks of 57 bits and one block of 39 bits. 18 tail bits of value zero are appended to the 39-bit block to bring it to 57 total. The coder then calculates and appends a six parity bit Hamming code to each 57 bit block and then calculates and appends an overall parity bit to each 63-bit block. Finally, after the codes are calculated the originally appended 18 zero tail bits are removed. The result is 7 64-bit blocks formed from the original 57-bit blocks and 1 46-bit block formed from the 39-bit block. The 46-bit block has parity bits based on the 39 bits plus 18 zeroes. The total 494 bits form the output 526 of the block coder 524 which is then coupled to the mapper 522 as a third 494-bit block input.

The PSK mapper takes the three inputs 530, 532, 526 of 494 bits each and builds a three-bit symbol from 000 to 111. In one embodiment, the symbols are built using the first line 530 as the least significant bit, then the second line 532 as the next bit and the third line 526 from the block coder as the most significant bit, however, the bits may be combined in any other way. Any one 924-bit block input to the demultiplexer 512 on the main input line 510 will accordingly be mapped into 494 consecutive three-bit symbols. These are mapped into the 8 PSK constellation for transmission over the channel in the form of I and Q coordinates on the I and Q lines 534, 536 as is well-known in the art. In the system architecture of FIG. 1, the PSK constellation is modulated onto the appropriate carrier and transmitted through antennas 18 or the antennas of the remote terminals 20, 22, 24. Table 5 below shows the respective values that would be produced on the I and Q lines for each possible binary symbol combination from 000 to 111.

the second 161 bits are sent to the block coder. The convolutional coder generates a 364 bit block that is divided by the serial to parallel mapper into two 182 bit blocks on lines 534 and 536. The extended Hamming coder, using the same 57-bit block-at-a-time scheme discussed above also creates a 182-bit block. The three 182-bit blocks are then mapped into three-bit symbols as discussed above. While two examples have been set forth herein, many more possibilities can be developed as is well-known in the art.

As can be seen from the specific example provided above, the configuration of FIG. 5 converts a 924-bit block into three 494-bit blocks that are mapped into 494 three-bit symbols, or, in the alternative, a 335-bit block is mapped into 182 three-bit symbols. Accordingly, the system provides roughly 2 bits-per-symbol. FIG. 5 does not show a block shaper 328 such as that shown in FIG. 3. In an embodiment in which the same hardware or software modules are used for both the system of FIG. 3 and of FIG. 5, the block shaper may still be present. It may be disabled by the controller 511 or it may be set to produce an input block that matches the output block. This can be accomplished, for example, with a look-up table in which the input matches the output or by a set of logical gates that produce the same output as the input. Alternatively, the block shaper can be used to shape the block coded block in a way that enhances the transmission of the symbols for the particular modulation involved.

Figure 6:
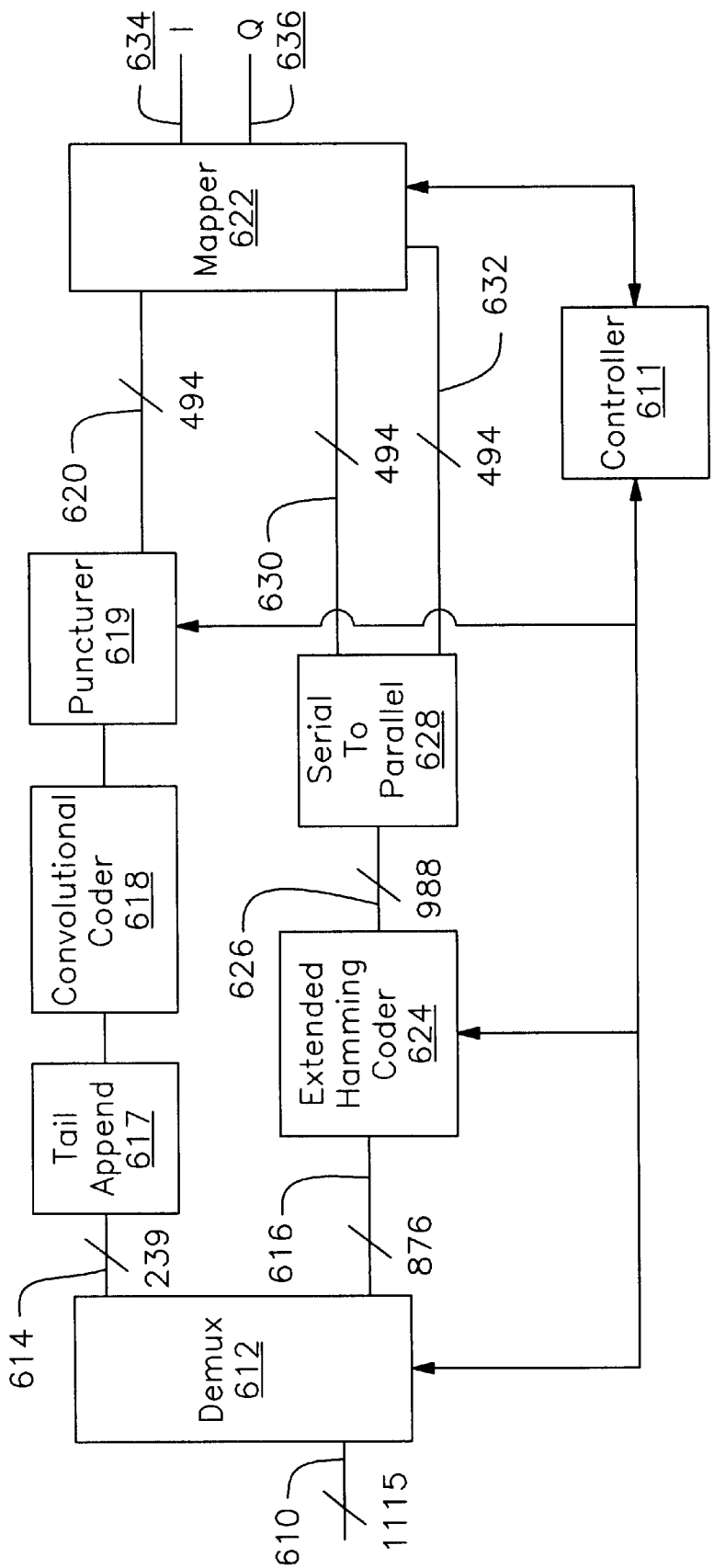
FIG. 6 is block diagram of a third configuration of a codec according to one embodiment of the present invention.

FIG. 6 shows a block diagram of another configuration of a signal modulator that uses the same building blocks as those discussed above. In one example, the blocks shown in FIG. 6 are also implemented in a general purpose DSP (digital signal processor) such as a Motorola 56300 series DSP.

| Point | 0 | 1 | 2 | 3 | 4 | 5 | 6 | 7 |
|---|---|---|---|---|---|---|---|---|
| I, Q | 0, 1 | $2^{-1/2}, 2^{-1/2}$ | 1, 1 | $-2^{-1/2}, 2^{-1/2}$ | $-1, 0$ | $-2^{-1/2}, -2^{-1/2}$ | $-1, -1$ | $2^{-1/2}, -2^{-1/2}$ |
| Symbol | 000 | 001 | 011 | 010 | 100 | 101 | 111 | 110 |
| Value | 0 | 1 | 3 | 2 | 4 | 5 | 7 | 6 |

Figure 7:
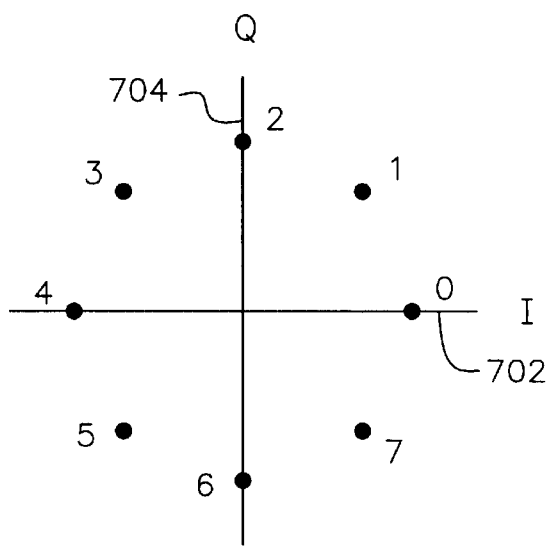
FIG. 7 is a diagram of a quadrature phase shift keyed constellation for use in one embodiment of the present invention.

FIG. 7 shows a typical 8 PSK constellation. The constellation has an I (in-phase) axis 702 and an orthogonal Q (quadrature) axis 704. Each of the eight constellation points are labeled from 0 to 7. These points correspond to the "Point" row shown in table 5 above. As the table shows, each point is associated with a binary number from 000 to 111 (with a corresponding decimal value from 0 to 7) and has corresponding I and Q coordinates. In the embodiment, shown by the table above, holding the two LSBs (least significant bits) fixed while changing the MSB (most significant bit) results in antipodal points, i.e. 0 and 4, 1 and 5, 2 and 6, 3 and 7. Stated another way, if the MSB is ignored, the two LSBs are Gray mapped as the symbols proceed around the 8PSK constellation, i.e. 00, 01, 11, 10, 00 etc. The particular details of which symbols are mapped to which point in the 8PSK constellation can be altered to suit the requirements of any particular channel using techniques well-known in the art. In addition other 8-ary or other multi-ary constellations can be used other than 8PSK.

As mentioned above, the size of the blocks input to the system can be varied in order to accommodate different system requirements. In the example above, a 924 bit block was selected for a downlink slot of 494 symbols. However, other size blocks can be used. In another example, mentioned above, the 182 symbols is selected for an uplink slot. To accommodate this smaller set of symbols, the input block on line 510 is 335 bits. This can be divided so that the first 174 bits are sent on line 514 to the convolutional coder and In one embodiment, the incoming bit stream 610 is processed in 1115-bit block. For the uplink slot 182 symbols has been selected for each slot, accordingly the input block has 405 bits. The particular selections of symbol rates and input block sizes can be selected to suit the particular application as appropriate. As before, the 1115-bit block is encrypted and contains some error detecting coding such as a 16-bit cyclic redundancy code in the last 16 bit positions.

The 1115 bits are divided roughly in quarters in the demultiplexer 612 so that roughly one-quarter goes to a 239 bit stream upper path 614 and roughly three quarters to a 876 bit stream lower path 616. The division is done by assigning the initial 239 bits to the upper path 614 and the succeeding 876 bits to the lower path 616. However, the bits can be divided in any convenient fashion that is reversible in a receive channel. The upper path is provided to a convolutional coder 618.

The convolutional coder 618 functions similarly to those described above to form a coded output bit stream of 494 bits. It is preceded by a tail append module 617 and followed by a puncturer 619. The 494-bit convolutionally coded blocks are passed next to a PSK mapper 622 which provides I and Q signal lines 634, 636 to be mapped into the 8PSK constellation.

In one embodiment, the coded output bit stream are punctured 619, as described above, to delete the fourth and sixth bit from every set of six bits. Accordingly the output encoded bit stream 620 of the convolutional coder is formed into 124 four-bit blocks. In order to maintain the coded output on line 620 at 494 bits, the input 614 to the convolutional coder is accordingly increased 617 to about 660 bits by appending tail bits 617 before coding. Other puncturing schemes may also be selected applying techniques well-known in the art.

The lower 876-bit output 616 of the demultiplexer 612 is applied to an extended Hamming coder 624. The extended Hamming coder first breaks the 876 bit block into 15 blocks of 57 bits and one block of 21 bits. 36 tail bits of value zero are appended to the 21-bit block to bring it to 57 total. The coder then calculates and appends a six parity bit Hamming code to each 57 bit block and then calculates and appends an overall parity bit to each 63-bit block. Finally, after the codes are calculated, the originally appended 36 zero tail bits are removed. The result is 15 64-bit blocks formed from the original 57-bit blocks and 1 28-bit block formed from the 21-bit block. The 28-bit block has parity bits based on the 21 bits plus 36 zeroes. The total 988 bits form the output 626 of the block coder 624.

The 988-bit coded block is passed next to a serial to parallel mapper 628. This mapper takes the odd bits and feeds them to an upper line 630 as a 494-bit block. The even bits are fed to a lower line output 632 as a second 494-bit block. The two output lines are connected to a second mapper, the PSK mapper 622 which provides I and Q signal lines 634, 636 to be mapped into the 8PSK constellation.

The 8PSK mapper 622 takes the three inputs 620, 630, 632 of 494 bits each and builds a three-bit symbol from 000 to 111. The symbols are built using the top line 630 from the block coder 624 as the most significant bit, then the lower line 632 from the block coder as the next bit and the convolutional coded line 620 as the least significant bit, however, the bits may be combined in any other way. Any one 1115-bit block input to the demultiplexer 612 on the main input line 610 will accordingly be mapped into 494 consecutive three-bit symbols. These are presented as I and Q coordinates on the I and Q lines 634, 636 and then mapped into the 8 PSK constellation for transmission over the channel as is well known in the art. Table 6 below shows the respective values that would be produced on the I and Q lines for each possible binary symbol combination from 000 to 111.

other size blocks can be used. In another example, mentioned above, 182 symbols is selected for an uplink slot. To accommodate this smaller set of symbols, the input block on line 610 is 405 bits. This can be divided so that the first 83 bits are sent on line 614 to the convolutional coder and the second 622 bits are sent to the block coder. The convolutional coder generates a 182-bit block that is fed to the mapper 622 on line 620. The extended Hamming coder, using the same 57-bit block at a time scheme discussed above creates a 364-bit block that is divided by the serial to parallel mapper into two 182-bit blocks on lines 630 and 632. The three 182-bit blocks are then mapped into three-bit symbols as discussed above. While two examples have been set forth herein, many more possibilities can be developed as is well-known in the art.

As can be seen from the specific example provided above, the present invention converts a 1115-bit block into three 494-bit blocks that are mapped into 494 three-bit symbols, or, in the alternative, a 405-bit block is mapped into 182 three-bit symbols. Accordingly, the system provides roughly 2 ½ bits per symbol. As with FIG. 5, FIG. 6 does not show a block shaper 328 such as that shown in FIG. 3. In an embodiment in which the same hardware or software modules are used for both the system of FIG. 3 and of FIG. 6, the block shaper may still be present. It may be disabled by the controller 511 or it may be set to produce an input block that matches the output block. As mentioned above, the block shaper can also be used to shape the block coded block in a way that enhances the transmission of the symbols for the particular modulation involved.

Figure 8:
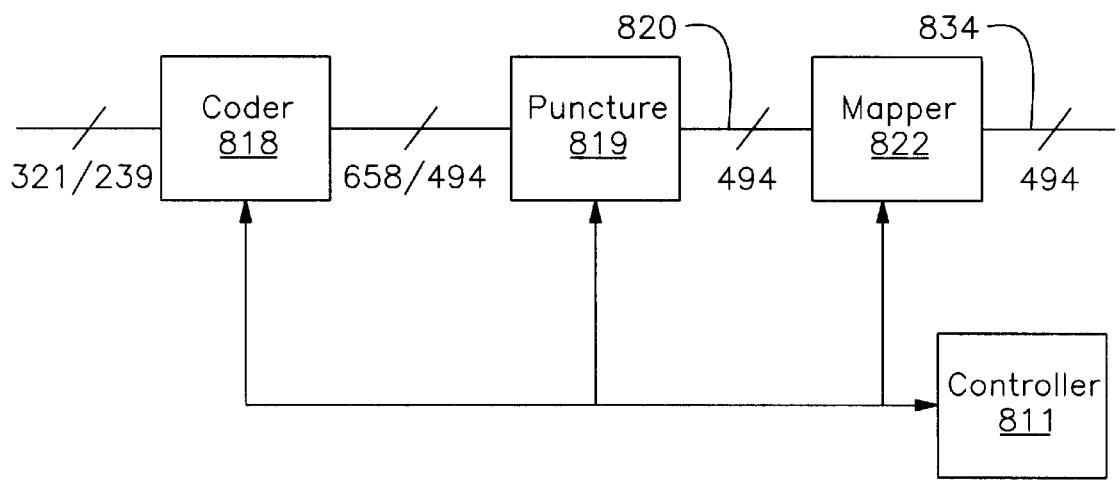
FIG. 8 is block diagram of a fourth configuration of a codec according to one embodiment of the present invention.

FIG. 8 shows a block diagram of another configuration for a signal modulator, corresponding to block 57 of FIG. 2, according to one embodiment of the present invention. In one embodiment, the incoming bit stream 810 is processed in either 321 or 239 bit blocks, depending on whether puncturing has been enabled or not, although the precise number of bits may be varied here as well as throughout the present description to better suit particular applications. In the present invention 321 and 239 have been chosen because applying the methods of the present invention maps the 321 or 239 bits into 494 symbols. For the uplink slot 182 symbols has been selected for each slot, accordingly the input block has either 113 or 83 bits. The particular selec-

| Point | 0 | 1 | 2 | 3 | 4 | 5 | 6 | 7 |
|---|---|---|---|---|---|---|---|---|
| I, Q | 0, 1 | $2^{-1/2}, 2^{-1/2}$ | 1, 1 | $-2^{-1/2}, 2^{-1/2}$ | $-1, 0$ | $-2^{-1/2}, -2^{-1/2}$ | $-1, -1$ | $2^{-1/2}, -2^{-1/2}$ |
| Symbol | 000 | 001 | 010 | 011 | 110 | 111 | 100 | 101 |
| Value | 0 | 1 | 2 | 3 | 6 | 7 | 4 | 5 |

Note that the symbols are not mapped in order as the circle is traversed. Instead, Gray labeling of the most significant two bits is used so that the most significant bits alternate at every other point as the circle is traversed. While the mapping is shown in Table 6 as directed to the corresponding binary number, any other type of mapping may be used as is well-known in the art. For example, binary values can be mapped to every other or every third or fourth point around the circle of the constellation in order to obtain a more desirable distribution of symbols for transmission. Accordingly, for example, 000 maps to point 0, while 001 maps to point 3,010 maps to point 6, etc.

As mentioned above, the size of the blocks input to the system can be varied in order to accommodate different system requirements. In the example above, a 1115-bit block was selected for a downlink slot of 494 symbols. However, tions of symbol rates and input block sizes can be selected to suit the particular application as appropriate. As before, controller 811 is coupled to each component in the system to set parameters and connections.

The input blocks arrive at an input line 810 to a coder 818, such as a convolutional coder similar to those discussed above. The output on line 814 is then provided to a puncturer 819 which can be enabled or disabled. In one embodiment, the puncturer punctures the coded output bit stream to delete the third bit from every block of four bits. Accordingly, the output encoded bit stream 818 of the convolutional coder is reduced to 494 bits for the 658 bit block and unaffected for the 494 bit block. The structure, after puncturing, is $c_1 c_2 c_4$, $c_5 c_6 c_8$, $c_9 c_{10} c_{12}$, . . . , where c represents a convolutionally coded bit.

The alternately punctured or not punctured 494-bit block is provided on line 820 to a mapper 822 which maps the data to a modulation scheme. The data is mapped to a phase shift keyed (PSK) constellation such as a binary PSK, Quadrature PSK or 8PSK constellation. If the bits are mapped to BPSK symbols, then the number of symbols will be the same as the number of bits, 494. However the input data blocks are increased by a third due to the application of puncturing.

As mentioned above, the size of the blocks input to the system can be varied in order to accommodate different system requirements. In the example above, a 321 or 239-bit block was selected for a downlink slot of 494 symbols. Accordingly, the system provides roughly ½ or ⅔ bits per symbol.

As can be seen from the discussion above, the present invention uses the same building blocks to generate many different modulation configurations. The examples provided above are intended as examples and not as an exhaustive list of all possibilities. The building blocks discussed above are a demultiplexer 312, 512, 612, a block coder 324, 524, 624, a convolutional coder 318, 518, 618, 818, a puncturer 319, 519, 619, 819, a constellation mapper 322, 522, 622, 822, a block shaper 328, a serial to parallel mapper 528, 628 and a tail bit appender 317, 517, 617. These blocks are controlled and connected into the various configurations by the controller 311, 511, 611, 811. Accordingly, using only the blocks shown the bit-per-symbol rate can be changed from ½ to 4 by resetting the various operating parameters of the various blocks.

The demultiplexer is set to divide the incoming bit stream into different size blocks. The convolutional coder is set to handle different size blocks with different numbers of appended tail bits. The puncturer is set for different puncture rates and to be enabled and disabled. The constellation mapper is set to support different constellations, to receive different numbers of inputs (2 or 3) and to map bit combinations to different points to improve the transmission channel's robustness. The block shaper is set to use different mapping tables to support different block sizes and bit rates. The serial to parallel mapper is also configurable to divide different inputs and to divide them in different ways. The functions of the constellation mapper, block shaper and serial to parallel mapper can be combined using more complicated look-up tables in order to simplify the structure of the different configurations. The controller acts to create all the changes in configuration discussed herein and accordingly, allows the modulator to support a variety of different rates. The different rates can all be supported without the need for completely different modulation systems and architectures, simplifying the modulator design.

What is claimed is:

1. An apparatus comprising:
    a demultiplexer to divide a bit stream into a first block at a first output and a second block at a second output;
    a convolutional coder coupled to the first output to encode the first block;
    a block coder coupled to the second output to encode the second block;
    a function module coupled to the block coder to apply one of a plurality of different functions to the encoded second block to produce a third block at an output;
    a mapper coupled to the function module output and to the convolutional coder to map the third block from the output of the function module and the encoded first block into one of a plurality of modulation constellations;
    a controller coupled to the demultiplexer to control the size of the first and second blocks, coupled to the block coder to control the block coding, and coupled to the function module to control the function to be applied.

2. The apparatus of claim 1 wherein the function module comprises a plurality of look-up tables and wherein the controller controls the look-up table to be applied to the encoded second block.

3. The apparatus of claim 2 wherein the plurality of look-up tables each receive a different number of bits and wherein the third block comprises a shaped block that has a number of digits that is the same for all look-up tables.

4. The apparatus of claim 3 wherein the shaped block comprises a block that is represented as a base 3 numeral.

5. The apparatus of claim 1 further comprising a puncturer coupled to the convolutional coder and wherein the controller is coupled to the puncturer to control the puncture rate.

6. The apparatus of claim 1 further comprising a divider to divide an input bitstream into two different output bitstreams and wherein the controller is coupled to the divider to control the input and output connections of the divider.

7. The apparatus of claim 6 wherein the mapper alternately receives a first bitstream from the convolutional coder or the block coder and alternately receives a second and third bitstream from the divider.

8. The apparatus of claim 1 wherein the block coder calculates a plurality of different block codes and wherein the controller determines which, if any, block code to calculate.

9. The apparatus of claim 1 wherein the block codes comprise parity codes and Hamming codes.

10. The apparatus of claim 1 wherein the convolutional coder comprises a 1 message bit per 2 coded bits convolutional coder.

11. The apparatus of claim 1, wherein the convolutional coder comprises a coder with at least 128 states and a constraint length of at least eight.

12. The apparatus of claim 1 wherein the modulation constellations comprise phase-shift keying constellations having differing numbers of constellation points.

13. The apparatus of claim 1 further comprising a tail bit module coupled to the demultiplexer first output to append a set of tail bits to the first block before it is encoded.

14. A method comprising:
    dividing a bit stream into a first block at a first output and a second block at a second output;
    convolutionally encoding the first block;
    block encoding the second block;
    applying one of a plurality of different functions in a function module to the encoded second block to produce a third block;
    mapping the third block from the function module and the encoded first block into one of a plurality of modulation constellations;
    controlling the size of the first and second blocks;
    controlling the block coding based on the size of the first and second blocks, and
    controlling the function to be applied by the function generator based on the size of the first and second blocks.

15. The method of claim 14 wherein applying one of a plurality of different functions comprises applying one of a plurality of different look-up tables and wherein controlling the function to be applied comprises controlling the look-up table to be applied.

16. The method of claim 15 wherein the plurality of look-up tables each receive a different number of bits and wherein the third block comprises a shaped block that has a number of digits that is the same for all look-up tables.

17. The method of claim 16 wherein the shaped block comprises a block that is represented as a base 3 numeral.

18. The method of claim 14 further comprising puncturing the convolutionally coded first block and controlling the puncture rate based on the size of the first and second blocks.

19. The method of claim 14 further comprising alternately dividing the convolutionally encoded first block and the third block into two partial blocks and wherein mapping into one of a plurality of modulation constellations comprises alternately mapping the partial blocks with the third block and mapping the partial blocks with the convolutionally encoded second block.

20. The method of claim 14 wherein the modulation constellations comprise phase-shift keying constellations having differing numbers of constellation points.

21. The method of claim 14 further comprising appending a set of tail bits to the first block before it is encoded.

22. A machine-readable medium having stored thereon data representing sequences of instructions which, when executed by a machine, cause the machine to perform operations comprising:

dividing a bit stream into a first block at a first output and a second block at a second output;

convolutionally encoding the first block;

block encoding the second block;

applying one of a plurality of different functions in a function module to the encoded second block to produce a third block;

mapping the third block from the function module and the encoded first block into one of a plurality of modulation constellations;

controlling the size of the first and second blocks;

controlling the block coding based on the size of the first and second blocks, and controlling the function to be applied by the function generator based on the size of the first and second blocks.

23. The medium of claim 22 wherein the instructions causing the machine to perform operations comprising applying one of a plurality of different functions further comprise instructions causing the machine to perform operations comprising applying one of a plurality of different look-up tables and wherein the instructions causing the machine to perform operations comprising controlling the function to be applied further comprise instructions causing the machine to perform operations comprising controlling the look-up table to be applied.

24. The medium of claim 23 wherein the plurality of look-up tables each receive a different number of bits and wherein the third block comprises a shaped block that has a number of digits that is the same for all look-up tables.

25. The medium of claim 24 wherein the shaped block comprises a block that is represented as a base 3 numeral.

26. The medium of claim 22 further comprising instructions causing the machine to perform operations comprising puncturing the convolutionally coded first block and controlling the puncture rate based on the size of the first and second blocks.

27. The medium of claim 22 further comprising instructions causing the machine to perform operations comprising alternately dividing the convolutionally encoded first block and the third block into two partial blocks and wherein the instructions causing the machine to perform operations comprising mapping into one of a plurality of modulation constellations further comprise instructions causing the machine to perform operations comprising alternately mapping the partial blocks with the third block and mapping the partial blocks with the convolutionally encoded second block.

28. The medium of claim 22 wherein the modulation constellations comprise phase-shift keying constellations having differing numbers of constellation points.

29. The medium of claim 22 further comprising instructions causing the machine to perform operations comprising appending a set of tail bits to the first block before it is encoded.

* * * * *